US012633322B2

(12) United States Patent
Kawasumi

(10) Patent No.: US 12,633,322 B2
(45) Date of Patent: May 19, 2026

(54) CURRENT DETECTOR AND INFORMATION PROCESSOR

(71) Applicant: Kioxia Corporation, Tokyo (JP)

(72) Inventor: Atsushi Kawasumi, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 130 days.

(21) Appl. No.: 18/421,801

(22) Filed: Jan. 24, 2024

(65) Prior Publication Data

US 2024/0282348 A1 Aug. 22, 2024

(30) Foreign Application Priority Data

Jan. 26, 2023 (JP) ................................. 2023-010509

(51) Int. Cl.
*G11C 7/06* (2006.01)
*H03K 19/21* (2006.01)
(52) U.S. Cl.
CPC ............. *G11C 7/065* (2013.01); *H03K 19/21* (2013.01)
(58) Field of Classification Search
CPC ....................................................... G11C 7/20
See application file for complete search history.

(56) References Cited

U.S. PATENT DOCUMENTS

| | | | | |
|---|---|---|---|---|
| 5,973,958 A | * | 10/1999 | Parker | ................... G11C 11/5621 |
| | | | | 365/185.18 |
| 2012/0126783 A1 | | 5/2012 | Jefremow et al. | |
| 2018/0315473 A1 | * | 11/2018 | Yu | ......................... G11C 11/412 |
| 2018/0342291 A1 | | 11/2018 | Wu et al. | |
| 2022/0078406 A1 | | 3/2022 | Xiu et al. | |
| 2022/0392524 A1 | * | 12/2022 | Chen | ....................... G06N 3/063 |

FOREIGN PATENT DOCUMENTS

JP 2022-516091 A 2/2022

* cited by examiner

*Primary Examiner* — Douglas King
(74) *Attorney, Agent, or Firm* — Foley & Lardner LLP

(57) ABSTRACT

A current detector includes: a plurality of memory cells configured to store a plurality of first data, each having a plurality of bits; a plurality of first wiring lines configured to transmit a result of a bit operation of each of the plurality of first data and second data having bits, the number of bits of the second data being the same as the number of bits of first data; and a detector configured to detect a first wiring line through which a lowest current flows among the plurality of first wiring lines.

17 Claims, 16 Drawing Sheets

10 : CURRENT DETECTOR

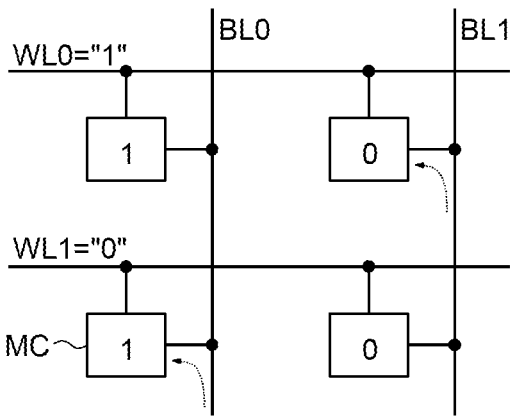
FIG. 2A
| | | BIT LINE | |
|---|---|---|---|
| | | 0 | 1 |
| WORD LINE | 0 | — | ↓ |
| | 1 | ↓ | — |
FIG. 2B
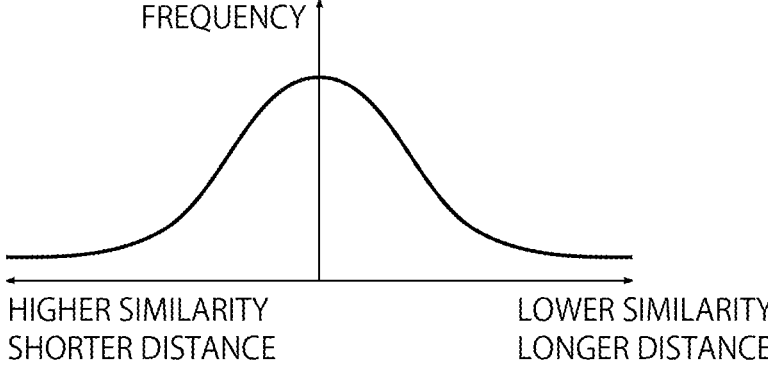
FREQUENCY
HIGHER SIMILARITY SHORTER DISTANCE          LOWER SIMILARITY LONGER DISTANCE
FIG. 3

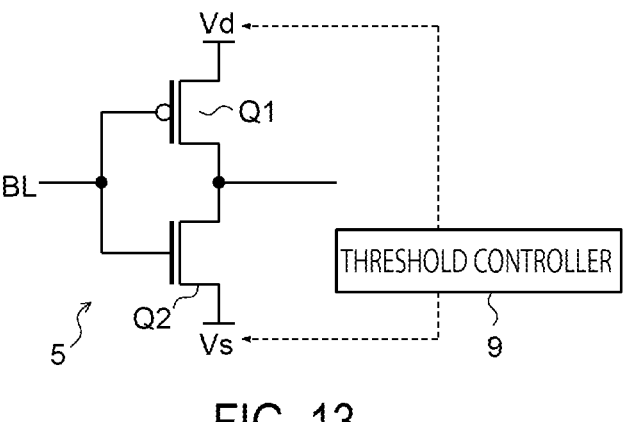
FIG. 13
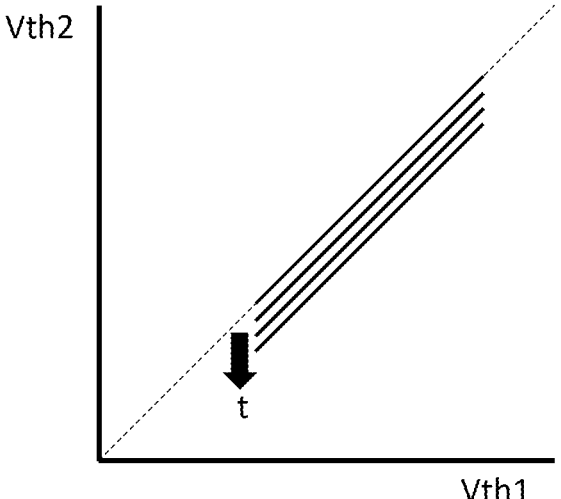
FIG. 14
FIG. 15

10 : CURRENT DETECTOR

CURRENT DETECTOR AND INFORMATION PROCESSOR

CROSS REFERENCE TO RELATED APPLICATIONS

This application is based upon and claims the benefit of priority from the prior Japanese Patent Application No. 2023-010509, filed on Jan. 26, 2023, the entire contents of which are incorporated herein by reference.

FIELD

One or more embodiments of the present invention relate to a current detector and an information processor.

BACKGROUND

The advancement in miniaturization and integration of semiconductor devices has enabled the semiconductor devices to perform a huge amount of operations, which have been performed by using software, at a high speed. In particular, the CIM (Computing In Memory) technique has been attracting attention, which uses a semiconductor memory to perform a huge amount of multiply-accumulate operations at a high speed.

In the CIM technique, for example, a current flowing through a wiring line such as a bit line is changed depending on an operation result. In this case, the magnitude of the current and the timing at which the current is changed need to be accurately detected. However, due to the manufacturing variations in semiconductor devices, the magnitude of the current may vary, or the timing at which the current is changed may shift, which results in incorrect operation results.

BRIEF DESCRIPTION OF THE DRAWINGS

FIG. 2A illustrates the arrangement of memory cells each storing a bit constituting first data, word lines, and bit lines.

FIG. 2B shows a truth table indicating a result of an exclusive NOR operation performed between the bits of first data and corresponding bits of second data.

FIG. 3 shows an example of distance distribution.

FIG. 13 illustrates a third example of a sense amplifier in which the threshold may be controlled.

FIG. 14 is a voltage waveform diagram showing a first voltage and a second voltage.

FIG. 15 schematically shows which of the threshold values is greater in the sense amplifier 5 shown in FIG. 13.

DETAILED DESCRIPTION

Figure 1:
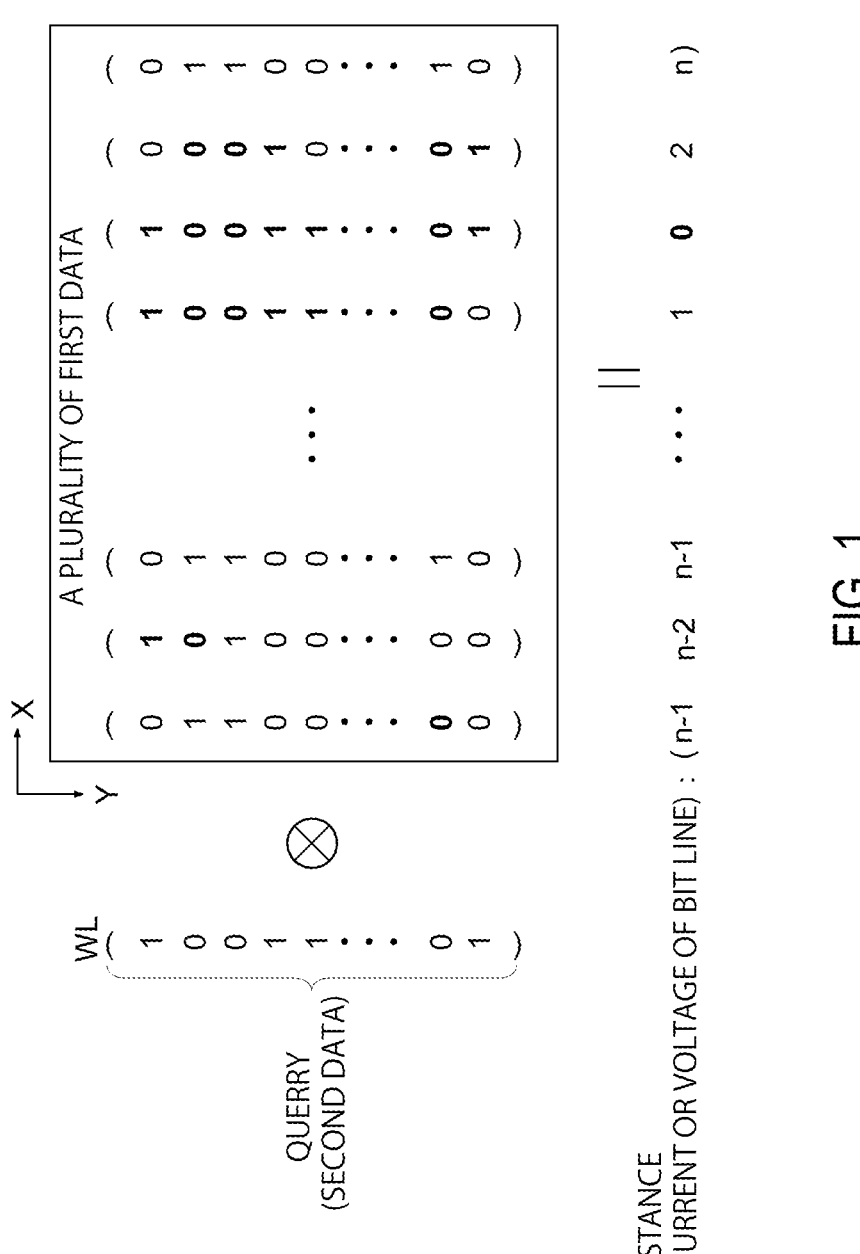
FIG. 1 is a diagram for explaining a basic concept of a current detector according to an embodiment.

A current detector according to the disclosure includes: a plurality of memory cells configured to store a plurality of first data, each having a plurality of bits; a plurality of first wiring lines configured to transmit a result of a bit operation of each of the plurality of first data and second data having bits, the number of bits of the second data being the same as the number of bits of the first data; and a detector configured to detect a first wiring line through which a lowest current flows among the plurality of first wiring lines.

Embodiments of a current detector and an information processor will be described below by referring to the accompanying drawings. In the following descriptions, major components of the current detector and the information processor will be mainly explained. However, the current detector and the information processor may have a component or a function that is not described herein or illustrated in the drawings. The following descriptions do not exclude such a component or function.

(Basic Concept of Current Detector)

FIG. 1 is a diagram for explaining the basic concept of a current detector according to an embodiment. FIG. 1 shows an example in which a plurality of first data is multiplied with second data. The first data and the second data are both bit string data, and each first data has the same number of bits as the second data. In FIG. 1, the plurality of first data are arranged in a first direction X, and in each set, bits are arranged in a second direction Y. The second data only has a single bit string, in which bits are arranged in the second direction Y. The second data may be called "Query." As will be described later, each bit in the bit strings of the first data is stored in a memory cell, for example. Although each bit of the first data and the second data has two values herein, it may have more than two values. Each bit of the second data corresponds to a signal logic a different word line WL, for example.

FIG. 1 shows an example of a bit operation of each bit string in the first data and the second data. For example, the bit operation is an exclusive NOR (XNOR) operation. Each result of the bit operation of one of the bit strings of the first data and the second data is outputted to a different first wiring line (for example, bit line). The number of bit strings of the first data is the same as the number of first wiring lines.

In FIG. 1, bits of the first data, which have the same values as corresponding bits in the second data, are thickened. As the number of thickened bits increases, the result in the exclusive NOR operation becomes greater. As all the bits in the third bit string from the right of the first data are the same as the bits of the second data, the result of the exclusive NOR for the third bit string is the greatest. A current corresponding to the result of the exclusive NOR operation flows through the corresponding bit line. For example, if all the bits in a bit string in the first data differ from the corresponding bits in the second data, the result of the exclusive NOR operation for each bit becomes zero. Therefore, the current flowing into each memory cell from the bit line becomes the greatest. On the other hand, if all the bits in a bit string in the first data are the same as the corresponding bits in the second data, the result of the exclusive NOR for each bit becomes 1. Therefore, no current flows into each memory cell from the bit line.

FIG. 2A illustrates the arrangement of memory cells MC each storing a bit constituting the bit string of the first data, word lines WL0, WL1, and bit lines BL0, BL1. FIG. 2B shows a truth table indicating a result of an exclusive NOR operation performed between the bits of the first data and the corresponding bits of the second data. Each down arrow in the truth table of FIG. 2B indicates that the result of the exclusive NOR is zero. In this case, a current flows into the corresponding memory cell MC from the bit line BL0 or BL1. The magnitude of the current flowing through each bit line BL0, BL1 corresponds to the number of bits that are the same in the first data and the second data in the bit operation. More specifically, as the number of matching bits increases in the bit operation of the first data and the second data, a lower current flowing through each bit line BL0, BL1. In other words, as the number of mismatched bits increases, a higher current flows through the bit line into the corresponding memory cell MC.

When the current flows from the bit line BL0, BL1 into the corresponding memory cell MC, the voltage of the bit line decreases. Therefore, as the number of mismatched bits becomes greater for the first data and the second data, the voltage of the corresponding bit line becomes lower.

If the first data and the second data are vectors having dimensions corresponding to the number of bits, the distance between the vector of the first data and the vector of the second data may be calculated by performing the bit operation of the first data and the second data. In the case where an exclusive NOR operation is performed for each bit of the first data and the second data, if the current flowing through a bit line is the lowest, this means that the distance between the vector of the first data and the vector of the second data is the shortest. On the contrary, if the current flowing through the bit line is the highest, the distance between the vector of the first data and the vector of the second data is the longest.

FIG. 3 shows an example of distance distribution, in which the horizontal axis represents the distance, and the vertical axis represents the frequency. In the example shown in FIG. 3, the distance follows a normal distribution. As the distance between the first data and the second data decreases, or increases, the frequency decreases. During the operation for obtaining the distance between the first data and the second data, there is a case where the detection of the first data and the second data for which the distance is the shortest or the longest is needed. In one or more embodiments, the value for which the result of the exclusive NOR for each bit of the first data and the second data is the smallest is detected. In other words, the shortest distance is detected.

Figure 4:
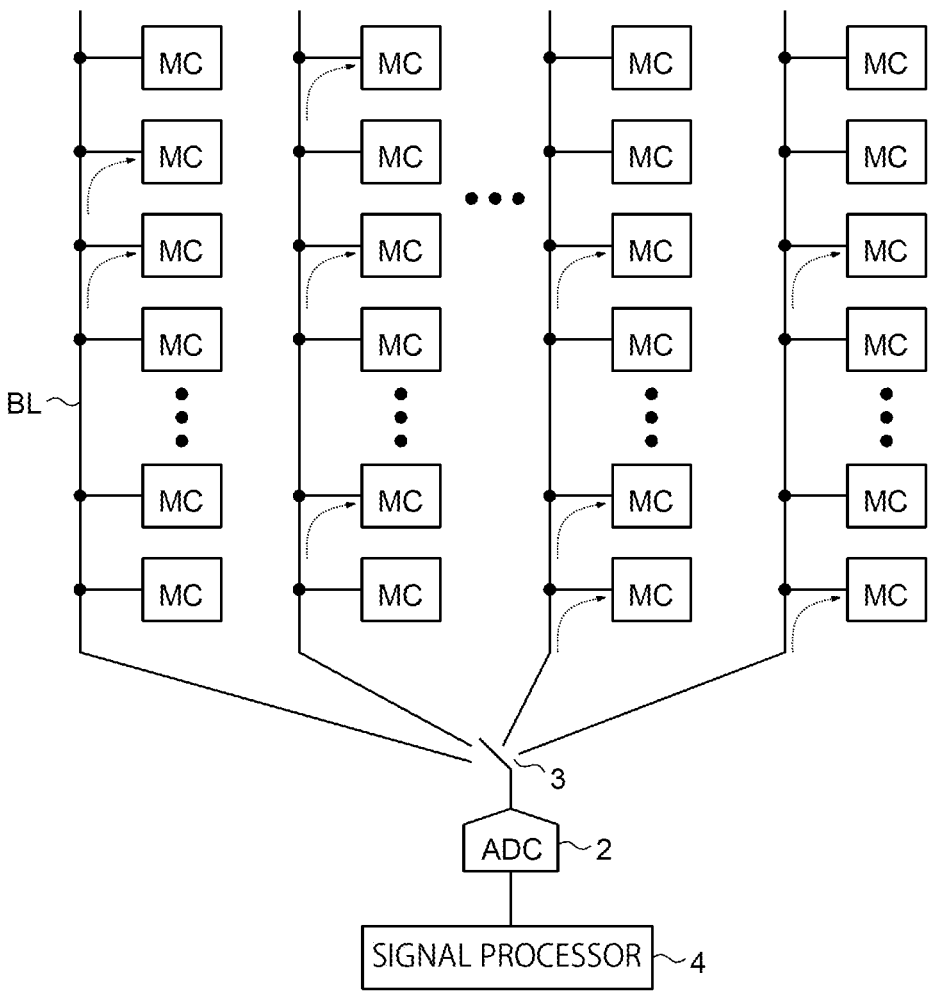
FIG. 4 is a block diagram schematically showing a method of detecting a current flowing through each bit line.

FIG. 4 is a block diagram schematically showing a method of detecting a current flowing through each bit line BL. In order to detect the current flowing through each bit line BL, an analog-to-digital converter ("ADC") 2 may be connected to an end of each bit line BL. Since the circuit area for the ADC 2 may be large, however, if a different ADC 2 is connected to each bit line BL, the circuit size increases. In order to solve this problem, a selector 3 for selecting any one of the bit lines BL, an ADC 2 connected to the selector 3, and a signal processor 4 are provided to the example shown in FIG. 4. The data on the bit line BL selected by the selector 3 is inputted to the ADC 2 for analog-to-digital conversion (AD conversion). The digital signal obtained as a result of the AD conversion at the ADC 2 is inputted to the signal processor 4 and used for calculating the shortest distance between the first data and the second data, for example.

Figure 5:
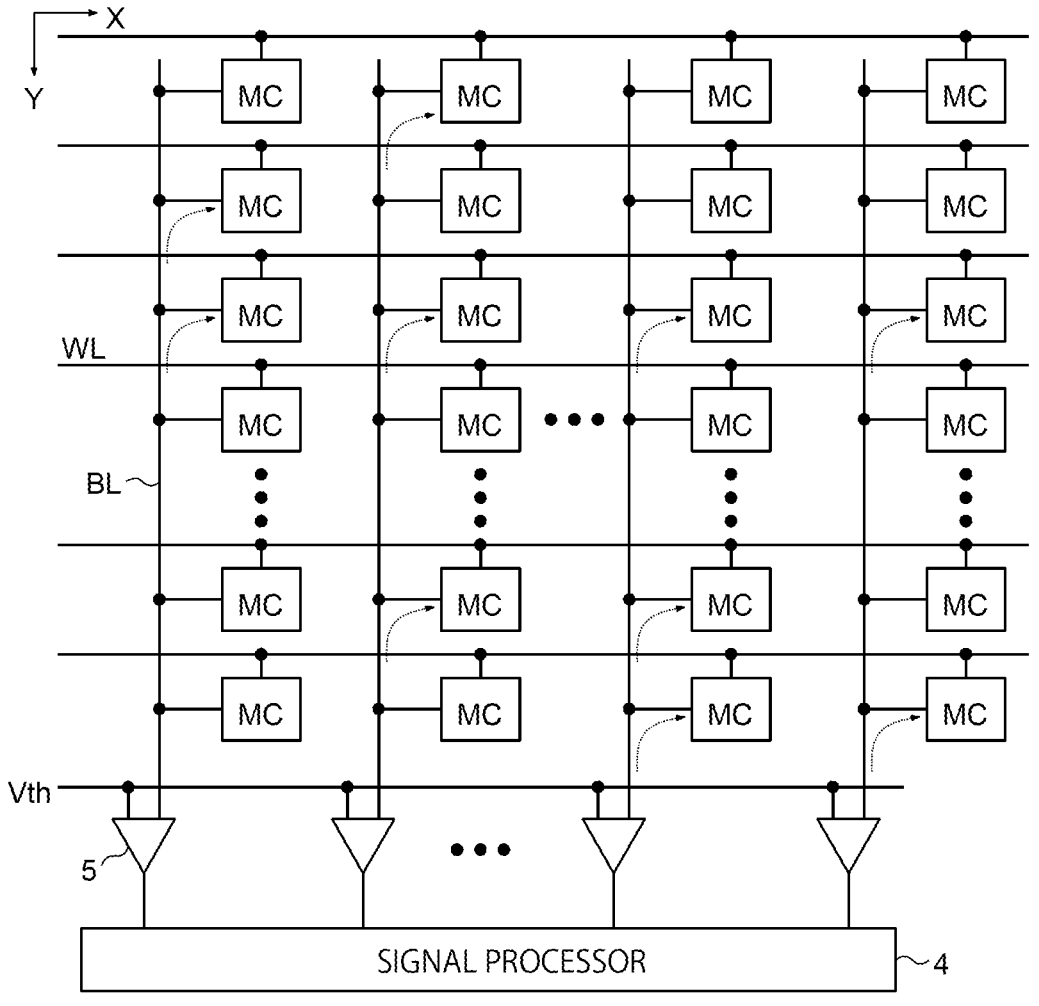
FIG. 5 is a block diagram showing an example in which sense amplifiers are disposed instead of an ADC.

The ADC 2 generally has a large circuit area, although it depends on the number of bits of the digital signal. In order to deal with this problem, the analog-to-digital conversion may be performed without using the ADC 2. FIG. 5 is a block diagram showing an example in which sense amplifiers are disposed instead of the ADC 2. In the example shown in FIG. 5, a sense amplifier 5 is connected to an end of each of a plurality of bit lines BL arranged in a first direction X, each bit line BL extending in a second direction Y. A current flowing through each bit line BL is converted to a voltage. Each of the sense amplifiers 5 outputs a binary voltage signal indicating whether the voltage of the bit line BL exceeds a predetermined threshold. The binary signal outputted from each sense amplifier 5 may be treated as a digital signal.

The sense amplifier 5 may be formed with a small number of transistors. Therefore, the circuit area of the sense amplifiers 5 may be considerably smaller than that of the ADC 2. A current detector according to a first embodiment is characterized by the use of sense amplifiers 5.

By using the sense amplifiers 5, for example, a first wiring line through which a highest current flows or a first wiring line through which a lowest current flows may be detected from a plurality of first wiring lines. In the following descriptions, an example in which the first wiring lines are bit lines BL will be explained.

Figure 6:
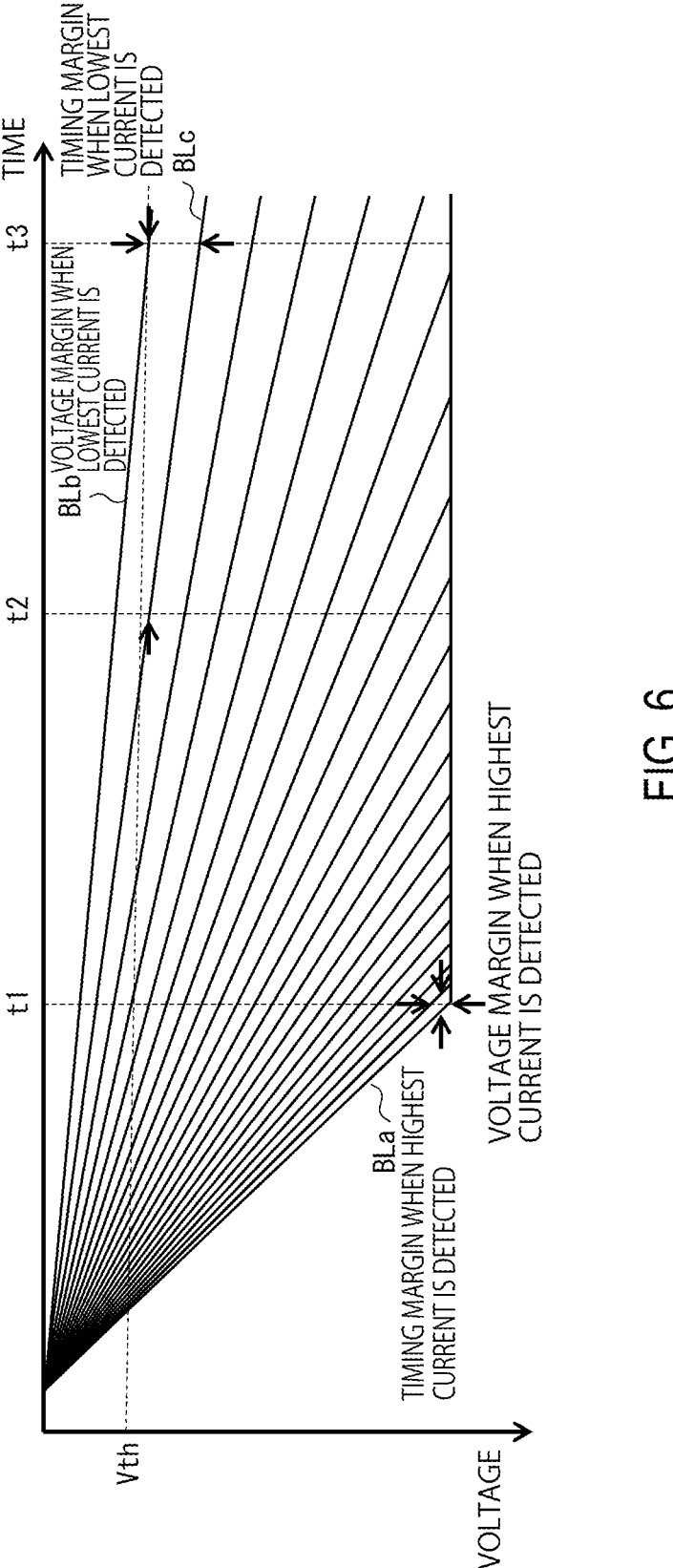
FIG. 6 is a diagram showing that the voltage of a bit line changes as the time passes.

FIG. 6 is a diagram showing that the voltage of a bit line changes as the time passes. The horizontal axis in FIG. 6 represents the time, and the vertical axis represents the voltage level of the bit line. As a result of exclusive NOR operation of a cell string of memory cell MCs arranged in the direction along which the bit line extends and a plurality of word lines, the voltage level of the bit line changes as the time passes. More specifically, as a result of the exclusive NOR operation, the current flowing through the bit line changes, which leads to a linear change in voltage of the bit line as the time passes. The voltage of the bit line does not fall under the ground level, and therefore clipped at the ground level as shown in FIG. 6.

In order to detect a bit line BLa through which a highest current flows from a plurality of bit lines, the voltage level at time t1 in each bit line may be measured, for example. At time t1, the voltage level of the bit line BLa through which the highest current flows is clipped. However, the voltage levels of the other bit lines have not reached the clipping voltage. Thus, by measuring the voltage level of each bit line, the bit line BLa may be detected as the bit line through which the highest current flows since the voltage of the bit line BLa has reached the clipping voltage. At time t1, however, differences in voltage level among the bit lines are slim, and therefore a margin for the variations in manufactured products may not be obtained for the sense amplifiers 5. This may result in an inaccurate detection of the bit line BLa through which the highest current flows.

On the other hand, in order to detect a bit line BLb through which the lowest current flows among the bit lines, at time t3, for example, the voltage level of each bit line is measured. Assuming that the threshold Vth of the sense amplifiers 5 is set at the voltage level shown by a broken line in FIG. 6, the voltage level of the bit line BLb, through which the lowest current flows, matches the threshold at time t3, and then the logic of the output signal from the sense amplifier 5 connected to this bit line is inverted. At this time, the logic of all other output signals from the sense amplifiers 5 connected to the other bit lines has been inverted. At time t3, the voltage difference between the voltage level of the bit line BLb through which the lowest current flows and the voltage level of the bit line BLc through which the second lowest current flows is sufficient for obtaining a margin of manufacturing variation of the sense amplifiers 5. The time difference between time t3 at which the logic of the output signal from the sense amplifier 5 connecting to the bit line BLb through which the lowest current flows is inverted and time t2 at which the logic of the output signal from the sense amplifier 5 connecting to the bit line BLc through which the second lowest current flows is inverted is also sufficient for obtaining a margin of manufacturing variation of the sense amplifiers 5.

Thus, although it is not easy to accurately detect the bit line BLa through which the highest current flows, it is relatively easy to accurately detect the bit line BLb through which the lowest current flows.

Figures 7A, 7B:
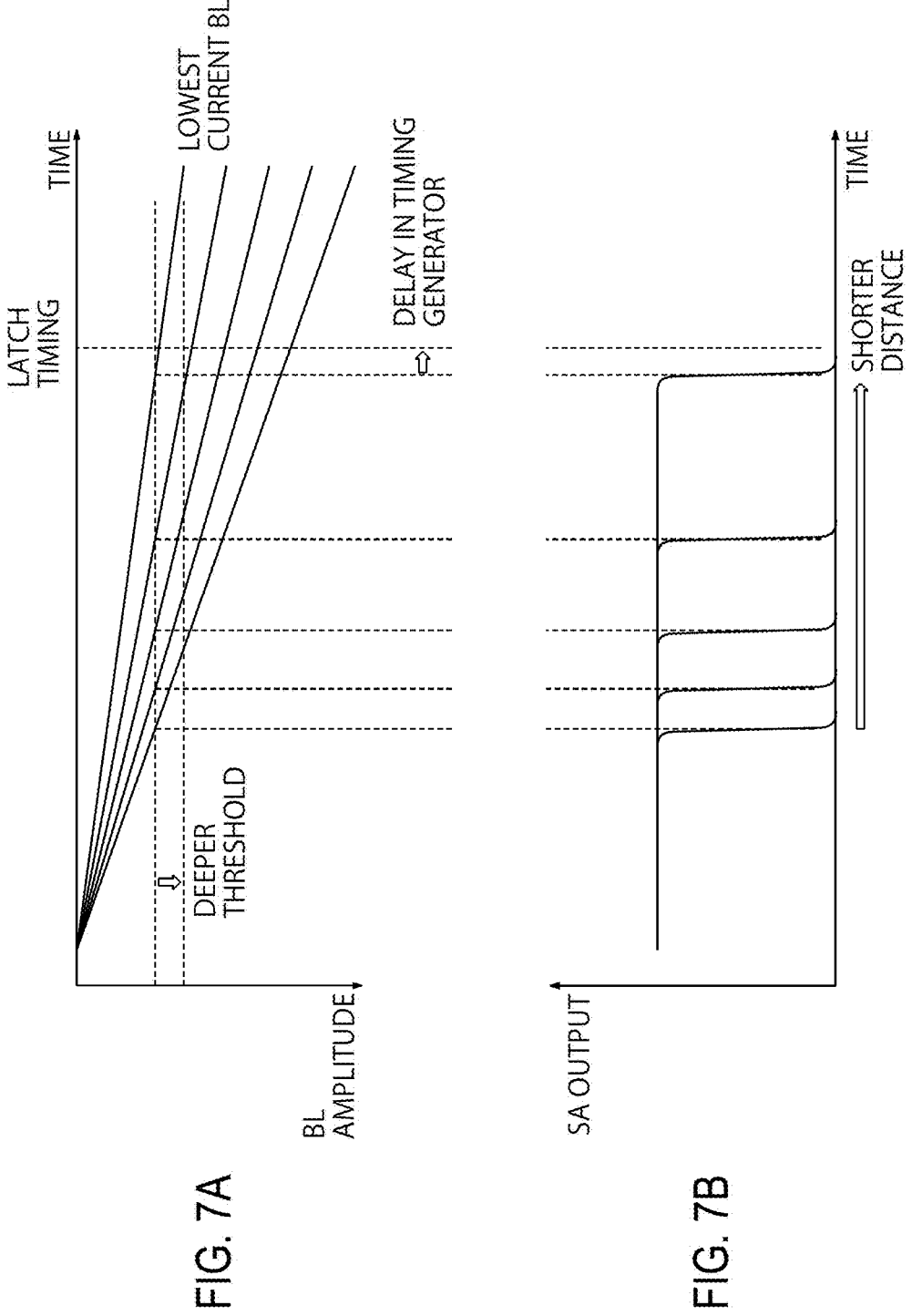
FIGS. 7A and 7B show examples in which the voltage level of the threshold of the sense amplifier is changed in various ways.

As described above, in order to detect the bit line BLb through which the lowest current flows from the plurality of bit lines, the voltage level of the threshold of the sense amplifier 5 needs to be appropriately set. FIGS. 7A and 7B show an example in which the voltage level of the threshold of the sense amplifier 5 is changed in multiple ways. FIG. 7A shows that the voltage of the bit line changes as the time passes, like FIG. 6. FIG. 7B shows that the voltage level of the output signal from the sense amplifier 5 changes as the time passes. The horizontal axis in FIG. 7B represents the time, and the vertical axis represents the voltage level.

As can be understood from FIGS. 7A and 7B, if the voltage level of the threshold is set to be higher than an optimum voltage level, the logic of the output signals from all the sense amplifiers 5 is inverted, and as a result, it cannot be correctly detected through which bit line the lowest current flows. Furthermore, since whether the logic of the output signals from a plurality of sense amplifiers 5 is inverted is detected via a timing generator connected after the sense amplifiers 5, the detection is performed later than the timing at which the output signals of all of the sense amplifiers 5 are inverted.

Figure 8:
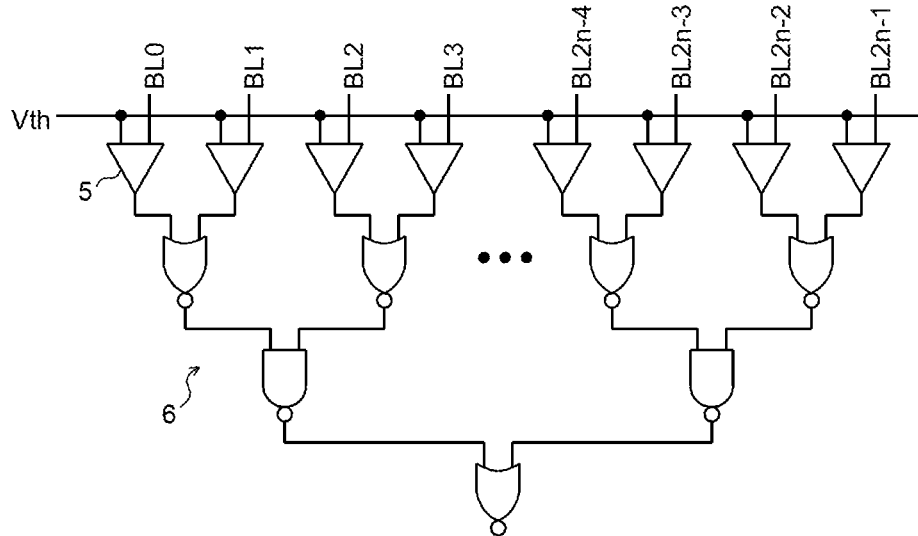
FIG. 8 is a circuit diagram showing an example of a timing generator.

FIG. 8 is a circuit diagram showing an example of a timing generator 6. The timing generator 6 shown in FIG. 8 is connected after the sense amplifiers 5, which are inverters for detecting whether the voltage of each bit line is greater than the threshold value. The timing generator 6 is formed by combining a plurality of NOR circuits and a plurality of NAND circuits. As the number of NAND circuits and NOR circuits increases, the period of time in which the output signal of the timing generator 6 is changed becomes longer. As a result, the detection of the timing at which the threshold and the voltage of the bit line crosses is delayed.

Therebefore, in order to accurately detect the bit line through which the lowest current flows, a sufficient time is needed between the timing at which the logic of the output signal from each of the sense amplifiers 5 connected to the corresponding bit line, which is not the bit line through which the lowest current flows, and the timing at which the logic of the output signal from the sense amplifier 5 connected to the bit line through which the lowest current flows.

Figure 9:
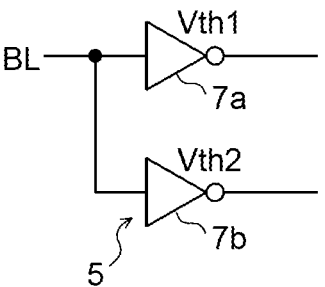
FIG. 9 illustrates a first example of a sense amplifier capable of controlling the threshold.

There may be several methods for controlling the threshold of the sense amplifiers 5. FIG. 9 illustrates a first example of the sense amplifier 5 capable of controlling the threshold. The sense amplifier 5 shown in FIG. 9 includes two inverters 7a and 7b, which have different threshold values. Either the inverter 7a or the inverter 7b is selected. The threshold values of the inverters 7a and 7b may vary due to the manufacturing variation or the like. Therefore, even if it is expected that the inverter 7a has a threshold value Vth1 and the inverter 7b has a threshold value Vth2 that is greater than the threshold value Vth1 in the sense amplifier 5 in FIG. 9, it may sometimes happen that the threshold value Vth2 is less than the threshold value Vth1 due to the manufacturing variation.

Figure 10:
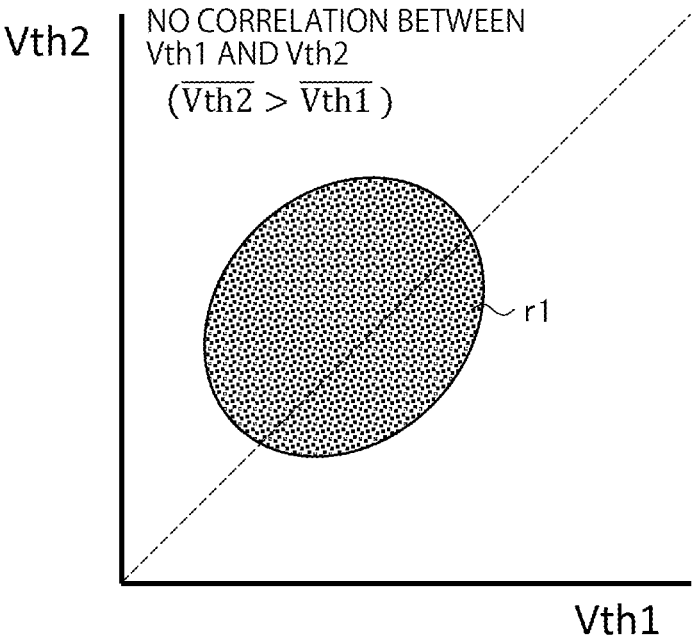
FIG. 10 schematically shows which of the threshold values is greater in the sense amplifier shown in FIG. 9.

FIG. 10 schematically shows which of the threshold values Vth1 and Vth2 is greater in the sense amplifier 5 shown in FIG. 9. The horizontal axis in FIG. 10 represents the threshold value Vth1, and the vertical axis represents the threshold value Vth2. Even if the sense amplifier 5 is designed so that the relationship between the threshold values is Vth2>Vth1, there may be a case where the relationship is reversed since the values of Vth1 and Vth2 may vary in the range r1 surrounded by a solid line in FIG. 10.

In order to avoid the problem of the sense amplifier 5 shown in FIG. 9, the sense amplifier 5 may need to be designed so that the threshold values Vth1 and Vth2 of the two inverters 7a and 7b are considerably different from each other. This makes the design complicated.

Figure 11:
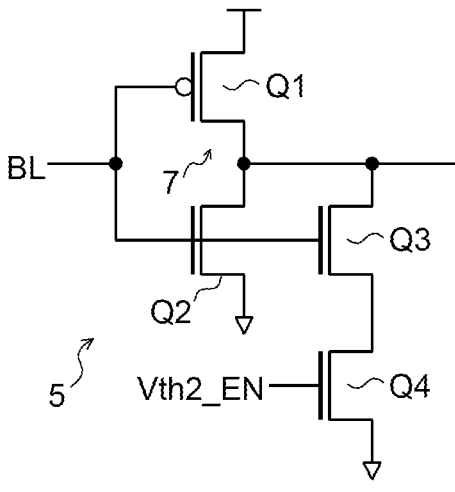
FIG. 11 illustrates a second example of a sense amplifier in which the threshold may be controlled.

FIG. 11 illustrates a second example of the sense amplifier 5 in which the threshold may be controlled. The sense amplifier 5 includes an inverter 7 including a PMOS transistor Q1 and an NMOS transistor Q2, which are cascode-connected, and two NMOS transistors Q3 and Q4 that are cascode-connected between an output node of the inverter 7 and a ground node. A bit line BL is connected to the gates of the PMOS transistor Q1 and the NMOS transistor Q2 in the inverter 7, and the gate of the NMOS transistor Q3. The threshold value Vth2 of the NMOS transistor Q3 is set to be greater than the threshold value Vth1 of the inverter 7, and an enable signal Vth2_EN for enabling the NMOS transistor Q3 is inputted to the gate of the NMOS transistor Q4.

Figure 12:
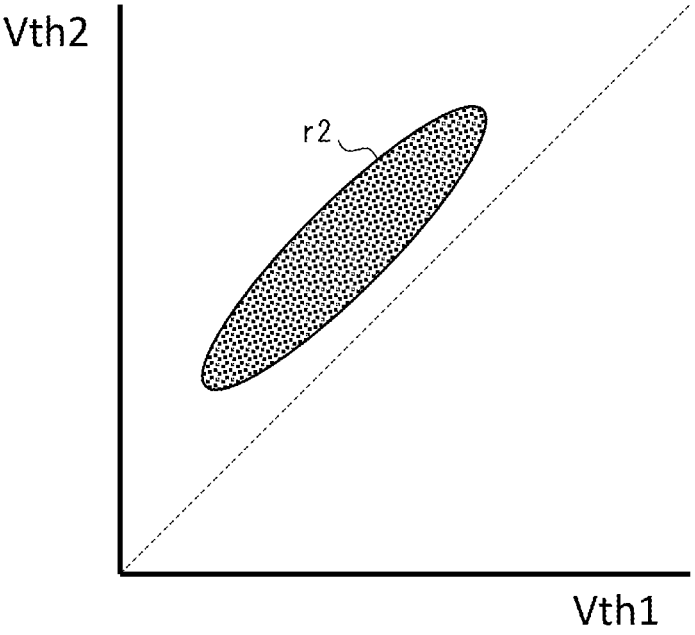
FIG. 12 schematically shows which of the threshold values is greater in the sense amplifier shown in FIG. 11.

FIG. 12 schematically shows which of the threshold values Vth1 and Vth2 is greater in the sense amplifier 5 shown in FIG. 11.

In the sense amplifier 5 shown in FIG. 11, the NMOS transistor Q2 in the inverter 7 and the NMOS transistor Q3 share the gate and the source. This helps maintaining the relationship Vth2>Vth1. However, due to the manufacturing variation, for example, the threshold values Vth1 and Vth2 may vary in the range r2 surrounded by a solid line in FIG. 12. As a result, the logic of the output signal from the sense amplifier 5 may be changed depending on the voltage level of the bit line BL.

FIG. 13 illustrates a third example of the sense amplifier 5 in which the threshold may be controlled. The sense amplifier 5 shown in FIG. 13 includes a PMOS transistor Q1 and an NMOS transistor Q2 cascode-connected between a first voltage node and a second voltage node. The first voltage node has a first voltage Vd and the second voltage node has a second voltage Vs, which are variably controlled by a threshold controller 9.

FIG. 14 is a voltage waveform diagram showing the first voltage Vd and the second voltage Vs. As shown in FIG. 14, in the initial state, the threshold controller 9 sets the first voltage Vd and the second voltage Vs to fixed voltage levels, and when the voltage values of all the bit lines cross the threshold at the timing t1, the first voltage Vd and the second voltage Vs start changing as the time passes. In the example shown in FIG. 14, the first voltage Vd and the second voltage Vs linearly decrease after the timing t1. The first voltage Vd and the second voltage Vs, however, may change non-linearly.

FIG. 15 schematically shows which of the threshold values Vth1 and Vth2 is greater in the sense amplifier 5 shown in FIG. 13. In the sense amplifier 5 shown in FIG. 13, the first voltage Vd and the second voltage Vs change in sync with each other. Therefore, the voltage difference between the threshold value Vth1 before being changed and the threshold value Vth2 after being changed may be shifted as the time passes, like those shown in FIG. 15. As a result, the influence of the manufacturing variation may decrease. Accordingly, in the embodiments described below, the sense amplifier 5 having the circuit configuration shown in FIG. 13, for example, is used.

First Embodiment

A current detector according to a first embodiment is characterized by the detection of a bit line, through which the lowest current flows, from a plurality of bit lines. In order to detect the bit line through which the lowest current flows, the current detector according to the first embodiment uses a plurality of sense amplifiers 5 to which a plurality of bit lines are connected.

Figure 16A:
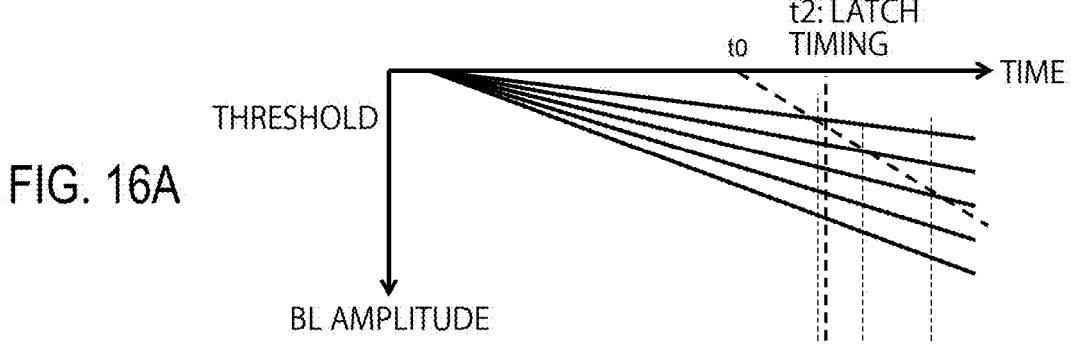
FIGS. 16A and 16B are diagrams showing an example in which the threshold value of the sense amplifier is linearly changed as the time passes.
Figure 16B:
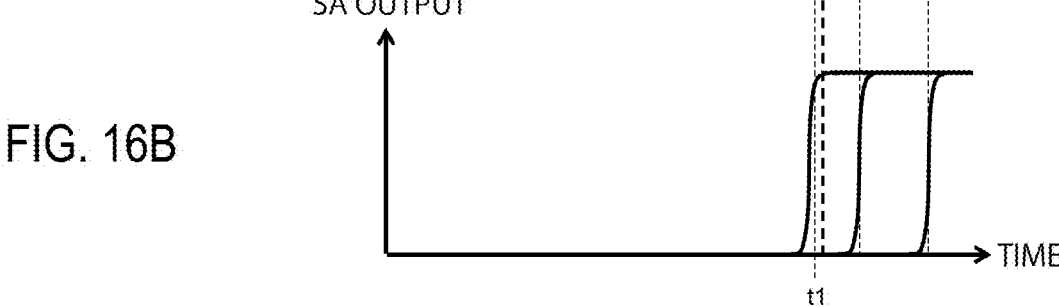

FIGS. 16A and 16B illustrate an example in which the threshold value of each sense amplifier (SA) 5 is linearly changed as the time passes. FIG. 16A shows that the voltages of the bit lines BL change as the time passes. The horizontal axis in FIG. 16A represents the time, and the vertical axis represents the voltage level of the bit line. A different current flows through each of the bit lines relating to FIG. 16A. The bit line associated with the smallest gradient is the bit line through which the lowest current flows.

FIG. 16B shows that the voltage level of the output signals from the sense amplifiers 5 changes as the time passes. The horizontal axis in FIG. 16B represents the time, and the vertical axis represents the voltage level.

A broken line in FIG. 16A shows that the voltage level of the threshold controlled by the threshold controller 9 changes as the time passes. The logic of the output signal from each sense amplifier 5 changes at the timing when the threshold value and the voltage value of the corresponding bit line cross each other.

At time t1 in FIG. 16A, the voltage value of the bit line through which the lowest current flows and the threshold value cross each other and the logic of the output signal from the corresponding sense amplifier 5 changes. By detecting the change in logic of the output signal from the sense amplifier 5 by means of the timing generator 6 shown in FIG. 8, for example, the bit line through which the lowest current flows may be detected. Since it takes some time to pass through the timing generator 6, the latching of the voltages of all the bit lines after the detection of the bit line through which the lowest current flows is performed at time t2.

In the case shown in FIG. 16A, the threshold controller 9 changes the threshold value linearly after a predetermined time to. In order to accurately detect the bit line through which the lowest current flows, the predetermined time to at which the threshold value starts changing and the gradient of the threshold value need to be set appropriately.

Figures 17A, 17B:
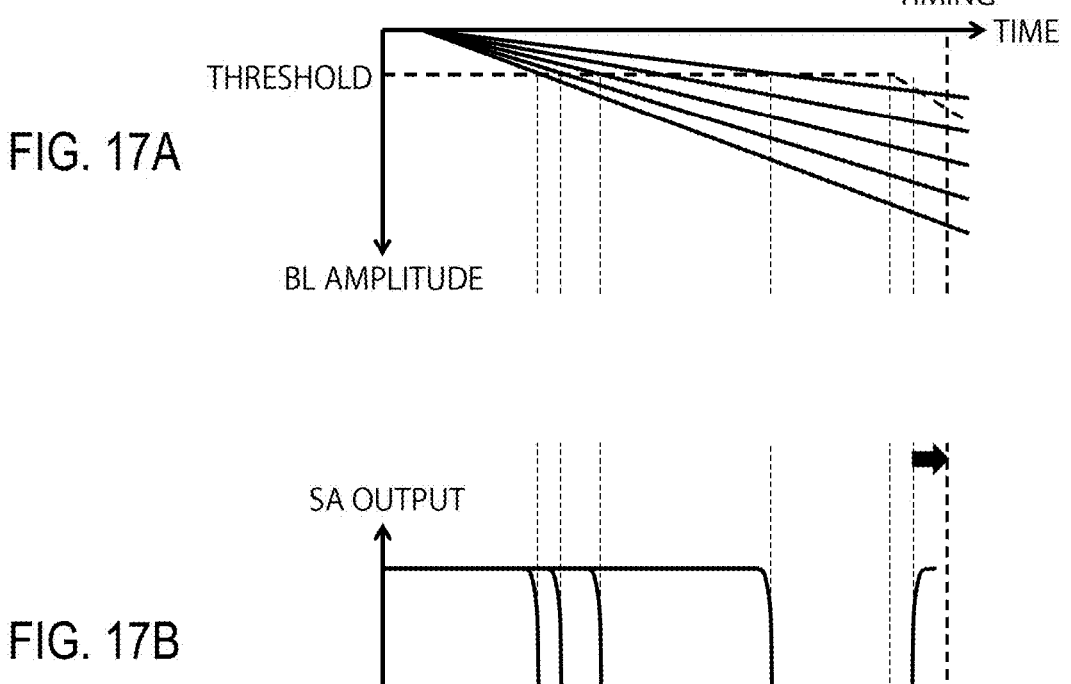
FIGS. 17A and 17B are diagrams for explaining timing at which the threshold value is changed.

FIGS. 17A and 17B are diagrams for explaining the timing at which the threshold value is changed. In the case of FIGS. 17A and 17B, the threshold controller 9 sets the threshold value as a predetermined voltage value in the initial state. The predetermined voltage value is set at a value that may cross the voltage values of all the bit lines.

At first timing t11, the voltage values of all the bit lines cross the threshold value. The threshold controller 9 linear then starts changing the threshold value at second timing t12, which is after the first timing t11. Thereafter, a detector 15, which will be described in detail later, detects a bit line having a voltage value that first crosses the threshold value at third timing t13 and determines such a bit line as the bit line through which the lowest current flows. A group of latches 16 then latch output signals from a group of the sense amplifier 5 at fourth timing t14.

If the gradient of the threshold value is too sharp after the threshold value is changed at the second timing t12, the time difference become short between the time when the voltage value of the bit line through which the lowest current flows matches the threshold value and the time when the voltage value of the bit line through which the second lowest current flows matches the threshold value. As a result, the margin for the manufacturing variation may not be obtained. On the other hand, if the gradient of the threshold value is too gentle, the voltage values of the bit lines may not cross the threshold value. The threshold controller 9 therefore changes the threshold value with an appropriate gradient.

Figure 18:
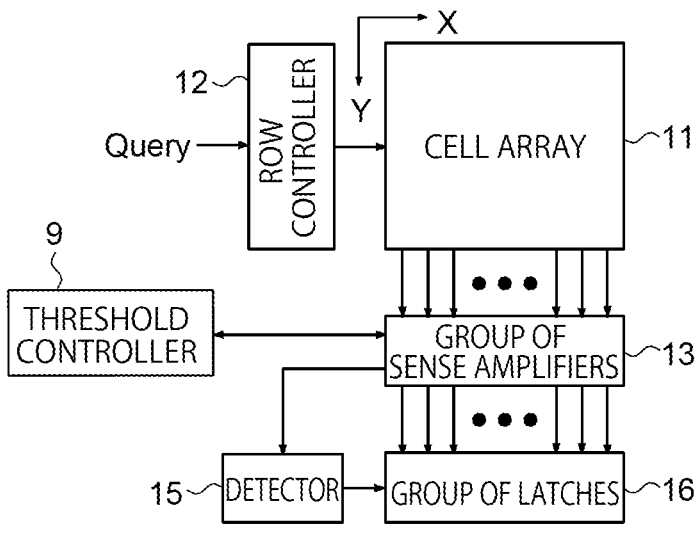
FIG. 18 is a block diagram schematically showing the configuration of a current detector according to a first embodiment.

FIG. 18 is a block diagram schematically showing the configuration of a current detector 10 according to the first embodiment. The current detector 10 shown in FIG. 18 includes a cell array 11, a row controller 12, a sense amplifier group 13, a threshold controller 9, a detector 15, and a group of latches 16.

The cell array 11 includes a plurality of memory cells MC arranged in the first direction X and the second direction Y as shown in FIG. 5. Each memory cell MC is a volatile memory such as a dynamic random access memory (DRAM) or a static random access memory (SRAM). Each memory cell MC may be a nonvolatile memory such as a NAND flash memory.

A first wiring line BL is disposed for each cell column including a plurality of memory cells MC arranged in the second direction Y in the cell array 11. A second wiring line WL is disposed for each cell row including a plurality of memory cells MC arranged in the first direction X in the cell array 11. The first wiring line may be called "bit line," and the second wiring line may be called "word line" herein.

As described above by referring to FIG. 1, each memory cell MC performs an exclusive NOR operation for each bit between the cell columns and the word lines in the cell array 11. Herein, the cell column may be called a "first data" and the word lines may be collectively called "second data," and each word line may be called a "bit" of the second data.

Depending on the result of the exclusive NOR operation between the cell columns and the word lines, the current flowing through the bit line changes. Specifically, a bit operation is performed for each bit of the first data corresponding to the cell column and each bit of the second data corresponding to the word lines, and the current flowing through the bit line is changed depending on the result of the bit operation. On such an occasion, as the bit match rate increases, the current flowing through the bit line decreases.

The voltage of the word lines is controlled by the row controller 12 based on a Query inputted from outside. The sense amplifier group 13 includes sense amplifiers 5. The bit lines arranged in the first direction X of the cell array 11 are connected to corresponding sense amplifiers 5. The group of latches 16 includes a plurality of latches corresponding to the sense amplifiers 5.

Figure 19:
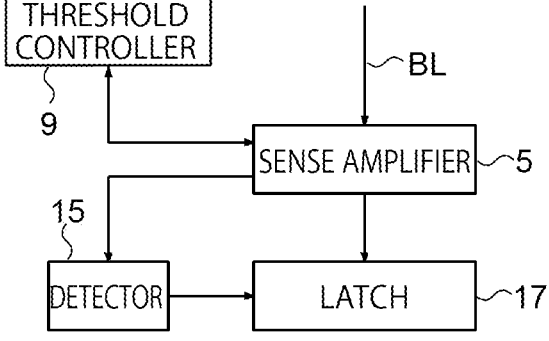
FIG. 19 shows the connection of one of the sense amplifiers and a corresponding latch.

FIG. 19 shows the connection of one of the sense amplifiers 5 and a corresponding latch 17. As will be described later, the output signals from all of the sense amplifiers 5 are latched by the corresponding latches 17 at the timing when a bit line through which the lowest current flows is detected, among the sense amplifiers 5.

Each sense amplifier 5 compares the voltage value of the corresponding bit line with a threshold value and outputs the comparison result. More specifically, each sense amplifier 5 switches the logic of its output signal based on whether the data (voltage value) of the corresponding bit line crosses the threshold value.

The threshold value of each sense amplifier 5 is controlled by the threshold controller 9. In the initial state, the threshold controller 9 sets the threshold at a predetermined voltage level, and changes the threshold as the time passes after the timing at which the voltage values of all the bit lines cross the threshold value. Specifically, the threshold controller 9 fixes the voltage level of the threshold for a short period of time after the current detector 10 starts operating, and changes the threshold after the timing at which the voltages of all the bit lines cross the threshold value.

For example, the threshold controller 9 changes the threshold value as the time passes after the second timing, which is later than the first timing when the voltage values of all the bit lines crossed the threshold value.

More specifically, after the second timing, the threshold controller 9 changes the threshold value by an amount per unit time that is greater than the amount per unit time of the change in voltage of each of the bit line. As a result, the threshold eventually crosses the voltage of each bit line without fail.

After the voltage values of all the bit lines cross the threshold value, the threshold controller 9 may linearly change the threshold as the time passes.

The detector 15 detects the bit line through which lowest current flows among the plurality of bit lines. The detector 15 may determine the bit line through which the lowest current flows at the timing when the logic of the output signal of any of the sense amplifiers 5 first changes during a period of time in which the threshold controller 9 changes the threshold value as the time passes. In more detail, the detector 15 may determine the first wiring line through which the lowest current flows at the timing when the logic of the output signal of any of the sense amplifier 5 first changes during a period of time in which the threshold controller 9 changes the threshold value as the time passes.

The main part of the sense amplifier 5 included in the sense amplifier group 13 shown in FIG. 18 includes an inverter having a circuit configuration similar to that shown in FIG. 13. The first voltage Vd at the first voltage node and the second voltage Vs at the second voltage node shown in FIG. 13 are controlled by the threshold controller 9. The threshold controller 9 changes the first voltage Vd and the second voltage Vs as shown in FIG. 14, for example, after the voltage values of all the bit lines cross the threshold value.

As described above, in the first embodiment, the voltage level of the threshold of the sense amplifier 5 is first fixed and then changed as the time passes after the second timing, which is after the first timing at which the voltage values of all the bit lines cross the threshold value. Thereafter, the bit line of which the voltage first crosses the threshold is detected as the bit line through which the lowest current flows. Thus, the bit line through which the lowest current flows may be accurately detected with a simple circuit configuration.

According to the first embodiment, even if the number of bits in the first data and the second data is large, or the number of the first data is large, the first data through which the lowest current flows may be detected without increasing the circuit size.

Since the bit operation of the first data and the second data may be performed using the memory cells MC, the current detector 10 may be formed by using an existing volatile or nonvolatile memory.

Second Embodiment

There may be a case where the current flowing through a bit line varies due to the manufacturing variation, which results in a change in voltage of the bit line.

Figure 20:
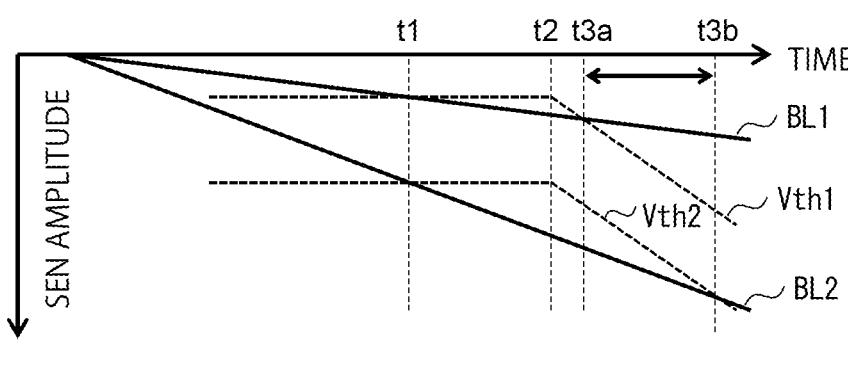
FIG. 20 illustrates that the voltages of two bit lines change as the time passes.

FIG. 20 illustrates that the voltages of two bit lines change as the time passes. It is assumed in the example shown in FIG. 20 that although the same current is intended to flow through the two bit lines BL1 and BL2, different amounts of current flow through them due to the manufacturing variation or the like, which results in differences in voltage of the bit lines BL1 and BL2.

In the case of FIG. 20, different threshold values Vth1 and Vth2 need to be set for the bit lines BL1 and BL2, respectively. Like the case shown in FIG. 17, the threshold controller 9 generates the threshold values Vth1 and Vth2, which are fixed at certain voltage levels in the initial state and start changing as the time passes after the first timing at which the voltage values of all the bit lines match the threshold values. The first timing t1 is the same for both the bit lines BL1 and BL2. At second timing t2, the threshold voltages start changing. After the second timing t2, timing t3a, at which the voltage value of the bit line BL1 matches the threshold value, is different from timing t3b, at which the voltage value of the bit line BL2 matches the threshold value. Therefore, the bit line through which the lowest current flows cannot be correctly detected.

Figure 21:
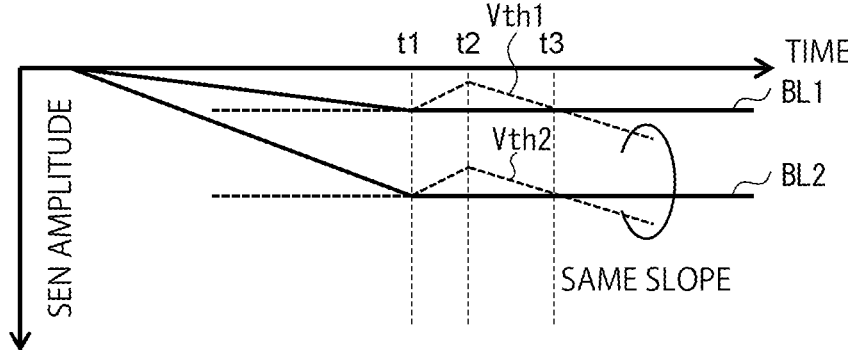
FIG. 21 shows a first example for solving the problem shown in FIG. 20.

FIG. 21 shows a first example for solving the problem shown in FIG. 20. In the first example shown in FIG. 21, when the voltage values of the bit lines BL1 and BL2 match the threshold values at first timing t1 during a period of time when the threshold values are still at the fixed voltage levels, the voltages of the bit lines BL1 and BL2 are latched by a holding circuit. After the first timing, the threshold controller 9 temporarily raises the threshold values as the time passes, and at the second timing t2, the threshold controller 9 starts decreasing the threshold values as the time passes.

The detector 15 detects the bit line through which the lowest current flows at third timing t3, at which the voltage values of the bit lines BL1 and BL2 held at the first timing t1 cross the threshold values.

Since the threshold voltages are temporarily raised and then decreased after the first timing t1, even if the voltage levels of the bit lines BL1 and BL2 change due to the manufacturing variation, the third timing t3 comes at the same time for the bit lines BL1 and BL2. As a result, the bit line through which the lowest current flows may be detected without being influenced by the voltage variations of the bit lines BL1 and BL2 caused by the manufacturing variation.

In more detail, after the first timing, the threshold controller 9 has a first period during which the threshold values are linearly increased, and a second period during which the threshold values are linearly decreased, the second period coming after the first period. The detector 15 detects the first wiring line (bit line) through which the lowest current flows at the third timing during the second period.

Figure 22:
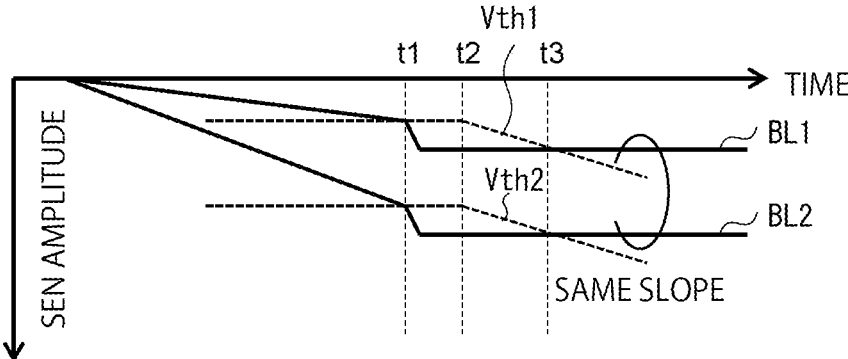
FIG. 22 shows a second example for solving the problem shown in FIG. 20.

FIG. 22 shows a second example for solving the problem shown in FIG. 20. In the example shown in FIG. 22, the threshold values generated by the threshold controller 9 are the same as those in FIG. 20. However, at the first timing t1 when the voltage values of all the bit lines cross the threshold values, the voltage values of all the bit lines are decreases by a predetermined value and held. After the second timing t2, the threshold values are linearly decreased and compared with the held voltage values of the respective bit lines.

As a result, like the case shown in FIG. 21, the voltage values of both the bit lines BL1 and BL2 match the threshold values at the third timing t3, and therefore the bit line through which the lowest current flows may be accurately detected.

Figure 23:
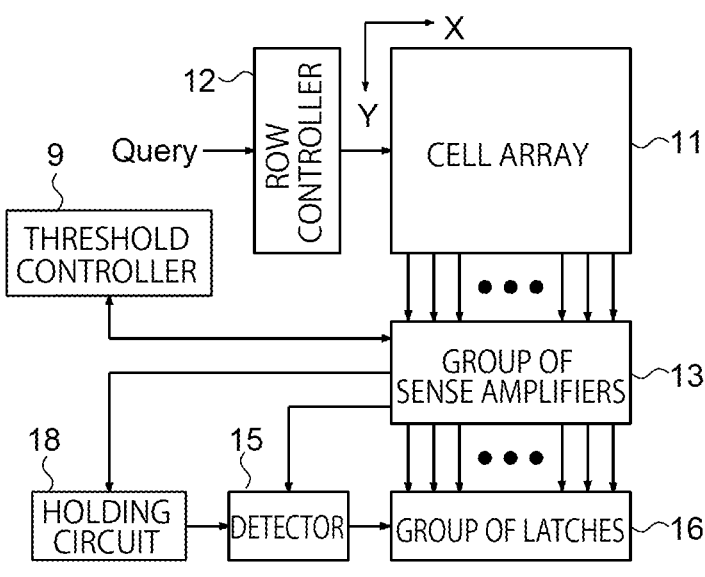
FIG. 23 is a block diagram of a current detector corresponding to the first example shown in FIG. 21.

The first example shown in FIG. 21 may be achieved by adding a holding circuit 18 to the current detector 10 shown in FIG. 18. FIG. 23 is a block diagram of the current detector 10 corresponding to the first example shown in FIG. 21. As described above, the holding circuit 18 shown in FIG. 23 holds the voltage values of all the bit lines at the first timing when the voltage values of all the bit lines cross the threshold values set at fixed voltage levels. Thereafter, the threshold controller 9 linearly changes the threshold values as the time passes. At the third timing when the held voltage values of the bit lines first cross the threshold values, the bit line through which the lowest current flows is detected.

Figure 24:
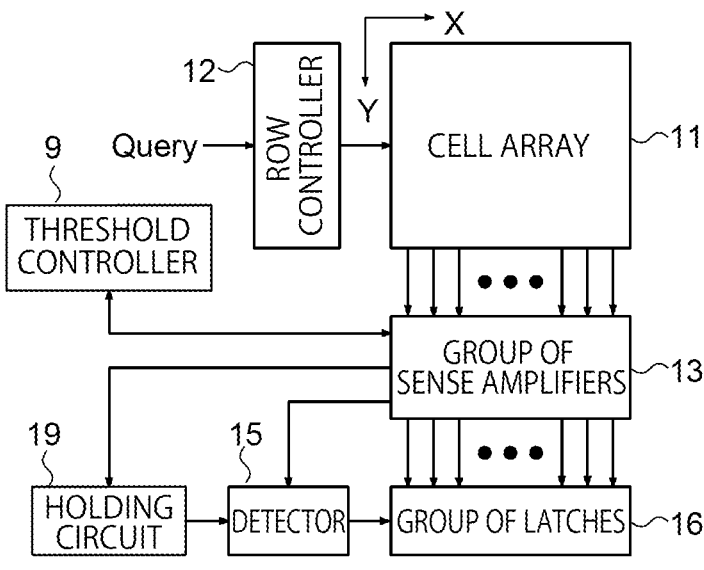
FIG. 24 is a block diagram of a current detector corresponding to the second example shown in FIG. 22.

The second example shown in FIG. 22 requires a holding circuit 19 that decreases the voltage values of all the bit lines by a predetermined value and holds the decreased voltage values at the first timing when the voltage values of all the bit lines cross the threshold values set at fixed voltage levels. FIG. 24 is a block diagram of the current detector 10 corresponding to the second example shown in FIG. 22. The current detector 10 shown in FIG. 24 includes a holding circuit 19, which has a configuration different from the configuration of the holding circuit 18 shown in FIG. 23. The holding circuit 19 decreases the voltage values of all the bit lines by a predetermined value and holds the decreased voltage values at the first timing t1 when the voltage values of all the bit lines cross the threshold values. The threshold controller 9 in the current detector 10 shown in FIG. 24 generates the threshold voltages that are kept at fixed voltage levels until the second timing, and then are changed as the time passes, as shown in FIG. 18.

As described above, in the second embodiment, even if the current flowing through bit lines varies due to the manufacturing variation or the like, the voltage values of all the bit lines may match the threshold values at the same timing since, after the first timing at which the voltage values of all the bit lines cross the threshold values fixed at certain voltage levels, the threshold values are increased as the time passes and then decreased as the time passes. Alternatively, in the second embodiment, the voltage values of all the bit lines may match the threshold values at the same timing since, at the first timing when the voltage values of all the bit lines match the threshold values fixed at certain voltage levels, the voltage values of all the bit lines are decreased by a predetermined value and held, and such voltage values are compared with the threshold values that are changed as the time passes.

Third Embodiment

The current detectors 10 according to the first and second embodiments may be used for measuring the distance between the first data and the second data.

Figure 25:
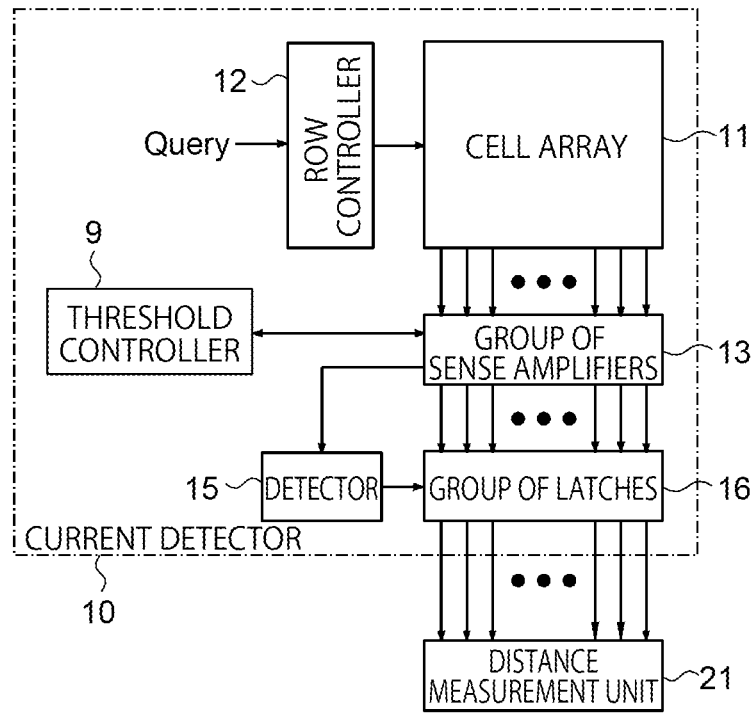
FIG. 25 is a block diagram showing an information processor including the current detector according to the first or second embodiment, and a distance measurement unit.

FIG. 25 is a block diagram showing an information processor 20 including the current detector 10 according to the first or second embodiment, and a distance measurement unit 21. The distance measurement unit 21 measures the distance between the first data and the second data transmitted to the first wiring line based on the lowest current flowing through the first wiring line detected by the detector. The block configuration shown in FIG. 25 may be obtained by adding the distance measurement unit 21 to the block configuration shown in FIG. 18. The block configuration obtained by adding the distance measurement unit 21 to the block configuration shown in FIG. 23 or FIG. 24 is also possible.

Even if the number of sets in the first data is large, the shortest distance may be calculated with a simple configuration by storing the bits of the first data in the memory cells MC, performing an exclusive NOR operation using the memory cells MC and the word lines, and changing the current flowing through the bit lines depending on the operation result.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An information processing apparatus comprising:
a plurality of memory cells configured to store a plurality of first data, each having a plurality of bits;
a plurality of first wiring lines configured to transmit a result of a bit operation of each of the plurality of first data and second data having bits, the number of bits of the second data being the same as the number of bits of the first data; and
a detector configured to detect a first wiring line through which a lowest current flows among the plurality of first wiring lines,
wherein each of the plurality of first wiring lines passes a current corresponding to the number of bits identical for each first data and the second data, and
each of the plurality of first wiring lines passes a lower current as the number of bits that match in each first data and the second data becomes greater.

2. The information processing apparatus according to claim 1, wherein the plurality of first wiring lines transmit a result of an exclusive NOR operation performed for each bit in each first data and the second data.

3. An information processing apparatus, comprising:
a plurality of memory cells configured to store a plurality of first data, each having a plurality of bits;
a plurality of first wiring lines configured to transmit a result of a bit operation of each of the plurality of first data and second data having bits, the number of bits of the second data being the same as the number of bits of the first data;
a detector configured to detect a first wiring line through which a lowest current flows among the plurality of first wiring lines;
a plurality of sense amplifiers configured to sense voltages of the plurality of first wiring lines; and
a plurality of latches configured to hold output signals from the plurality of sense amplifiers at timing when the first wiring line through which the lowest current flows is detected by the detector.

4. The information processing apparatus according to claim 3, wherein each of the plurality of sense amplifiers switches a logic of an output signal depending on whether a voltage value of the corresponding first wiring line is greater than a threshold value.

5. The information processing apparatus according to claim 4, further comprising a threshold controller configured to control the threshold value as time passes.

6. The information processing apparatus according to claim 5,
wherein voltage levels of the plurality of first wiring lines change as the time passes based on the result of the bit operation of each first data and the second data,
wherein in an initial state, the threshold controller sets the threshold value at a predetermined voltage level, and changes the threshold value as the time passes after timing at which voltage values of the plurality of first wiring lines cross the threshold value.

7. The information processing apparatus according to claim 6, wherein the threshold controller changes the threshold value as the time passes after second timing, which is later than first timing at which the voltage values of the plurality of first wiring lines cross the threshold value.

8. The information processing apparatus according to claim 7, wherein after the second timing, the threshold controller changes the threshold value by an amount per unit time that is greater than an amount per unit time of a change in voltage of the plurality of first wiring lines.

9. The information processing apparatus according to claim 7, wherein after the second timing, the threshold controller linearly changes the threshold value as the time passes.

10. The information processing apparatus according to claim 6, wherein the detector detects the first wiring line through which the lowest current flows at timing when a logic of an output signal from any of the plurality of sense amplifiers is first changed during a period of time in which the threshold controller changes the threshold value as the time passes.

11. The information processing apparatus according to claim 6,
wherein each of the plurality of sense amplifier includes an inverter including a first transistor and a second transistor of different conductivity types, which are connected between a first voltage node and a second voltage node,
wherein the threshold controller sets voltages of the first voltage node and the second voltage node at predetermined initial voltage values until the voltage values of the plurality of first wiring lines cross the threshold value, and change the voltages of the first voltage node and the second voltage node as the time passes after the timing at which the voltage values of the plurality of first wiring lines cross the threshold value.

12. The information processing apparatus according to claim 6, further comprising a holding circuit configured to hold the voltage levels of the plurality of first wiring lines at first timing when the voltage values of the plurality of first wiring lines cross the threshold value,
wherein the threshold controller temporarily increases and then decreases the threshold value after the first timing,
wherein after the first timing, the detector detects the first wiring line through which the lowest current flows at third timing when the voltage levels of the plurality of first wiring lines held by the holding circuit match the threshold value controlled by the threshold controller.

13. The information processing apparatus according to claim 12,
wherein the threshold controller has a first period in which the threshold value is linearly increased after the first timing, and a second period in which the threshold value is linearly decreased after the first period,
wherein the detector detects the first wiring line through which the lowest current flows at the third timing in the second period.

14. The information processing apparatus according to claim 6, further comprising a holding circuit configured to hold voltage values obtained by decreasing the voltage levels of the plurality of first wiring lines by a predetermined voltage value at timing when the voltage values of the plurality of first wiring lines cross the threshold value,
wherein after the timing at which the voltage values of the plurality of first wiring lines cross the threshold value, the detector detects the first wiring line through which the lowest current flows when any of the voltage values of the plurality of first wiring lines held by the holding circuit first matches the threshold value controlled by the threshold controller.

15. The information processing apparatus according to claim 1,
wherein the plurality of memory cells are arranged in a first direction and a second direction, the first direction and the second direction crossing each other,
wherein the current detector further comprises a plurality of second wiring lines arranged in the second direction, each second wiring line extending in the first direction, the second wiring lines transmitting signals of controlling write and read operations performed on the memory cells, and being set at a voltage corresponding to the second data,
wherein each of the plurality of first wiring lines transmits the result of the bit operation of the plurality of first data read from the plurality of memory cells arranged in the second direction and the second data of the plurality of second wiring lines arranged in the second direction.

16. The information processing apparatus according to claim 3,
wherein the plurality of memory cells are arranged in a first direction and a second direction, the first direction and the second direction crossing each other,
wherein the current detector further comprises a plurality of second wiring lines arranged in the second direction, each second wiring line extending in the first direction, the second wiring lines transmitting signals of controlling write and read operations performed on the memory cells, and being set at a voltage corresponding to the second data, wherein each of the plurality of first wiring lines transmits the result of the bit operation of the plurality of first data read from the plurality of memory cells arranged in the second direction and the second data of the plurality of second wiring lines arranged in the second direction.

17. An information processor processing apparatus comprising:

a plurality of memory cells configured to store a plurality of first data, each having a plurality of bits;

a plurality of first wiring lines configured to transmit a result of a bit operation of each of the plurality of first data and second data having bits, the number of bits of the second data being the same as the number of bits of the first data;

a detector configured to detect a first wiring line through which a lowest current flows among the plurality of first wiring lines; and a distance measurement unit configured to measure a distance between the first data and the second data transmitted to the first wiring line, based on the lowest current flowing through the first wiring line detected by the detector, wherein each of the plurality of first wiring lines passes a current corresponding to the number of bits identical for each first data and the second data, and each of the plurality of first wiring lines passes a lower current as the number of bits that match in each first data and the second data becomes greater.

* * * * *